United States Patent [19]

Bergemont

[11] Patent Number: 5,464,999
[45] Date of Patent: Nov. 7, 1995

[54] METHOD FOR PROGRAMMING AN ALTERNATE METAL/SOURCE VIRTUAL GROUND FLASH EPROM CELL ARRAY

[75] Inventor: Albert Bergemont, San Jose, Calif.

[73] Assignee: National Semiconductor Corporation, Santa Clara, Calif.

[21] Appl. No.: 230,545

[22] Filed: Apr. 20, 1994

Related U.S. Application Data

[62] Division of Ser. No. 830,938, Feb. 4, 1992, Pat. No. 5,346,842.

[51] Int. Cl.$^6$ .............................. H01L 29/68; H01L 29/78
[52] U.S. Cl. ...................... 257/322; 257/316; 365/185.01
[58] Field of Search ................................. 257/316, 321, 257/322, 315; 365/185

[56] References Cited

U.S. PATENT DOCUMENTS

| | | |
|---|---|---|
| 4,874,715 | 10/1989 | Paterson. |
| 5,017,980 | 5/1991 | Gill et al. ............................ 257/321 |
| 5,149,665 | 9/1992 | Lee. |
| 5,151,375 | 9/1992 | Kazerounian et al. .................... 437/43 |

FOREIGN PATENT DOCUMENTS

| | | | |
|---|---|---|---|
| 0461764A2 | 12/1991 | European Pat. Off. | ...... H01L 27/115 |
| 0464432A2 | 1/1992 | European Pat. Off. | ...... H01L 27/115 |
| 57-102073 | 6/1982 | Japan | .............................. H01L 29/78 |
| 1-152673 | 6/1989 | Japan | .............................. H01L 29/78 |
| 2234834 | 2/1991 | United Kingdom | .............. G11C 7/00 |
| 2241380 | 8/1991 | United Kingdom | .......... H01L 29/788 |

OTHER PUBLICATIONS

Gautam Verma, et al.; "Reliability Performance of ETOX Based Flash Memories".
B. J. Woo, et al.; "A Poly–Buffered Face Technology for High Density Flash Memories"; VLSI Symposium 1991.
B. J. Woo et al.; "A Novel Memory Cell Using Flash Array Contactless EPROM (Face) Technology"; IEEE 1990, IEDM 90–91.
Yosiaki S. Hisamune et al.; "A 3.6 uM$^2$ Memory Cell Structure for 16 Mb EPROMS"; IEDM 1989 p. 583.
Albert Bergemont et al.; "A High Performance CMOS Process for Submicron 16 MB EPROM"; 1989 IEEE IEDM p. 591.

Primary Examiner—Jerome Jackson
Assistant Examiner—John Guay
Attorney, Agent, or Firm—Limbach & Limbach

[57] ABSTRACT

The present invention provides a method of programming and erasing an alternate metal/source virtual ground flash EPROM cell array. The method imparts the ease of the program/erase mechanism of the conventional T-shaped ETOX cell to a contactless architecture with much smaller cell size and easier scalability and with improved drain turn on.

1 Claim, 12 Drawing Sheets

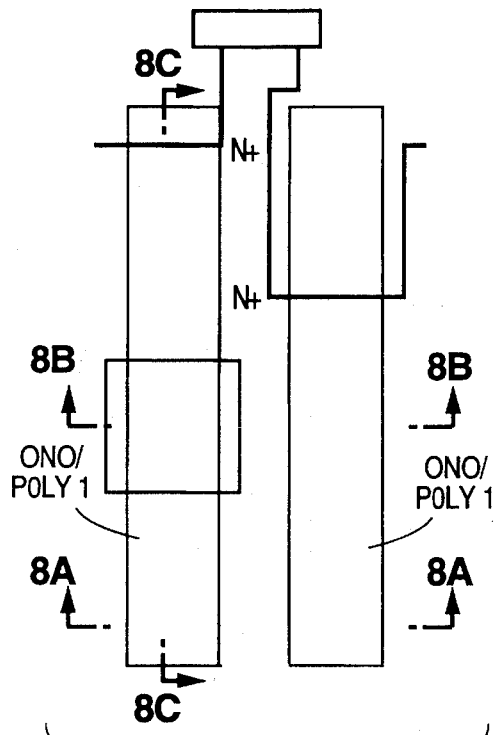
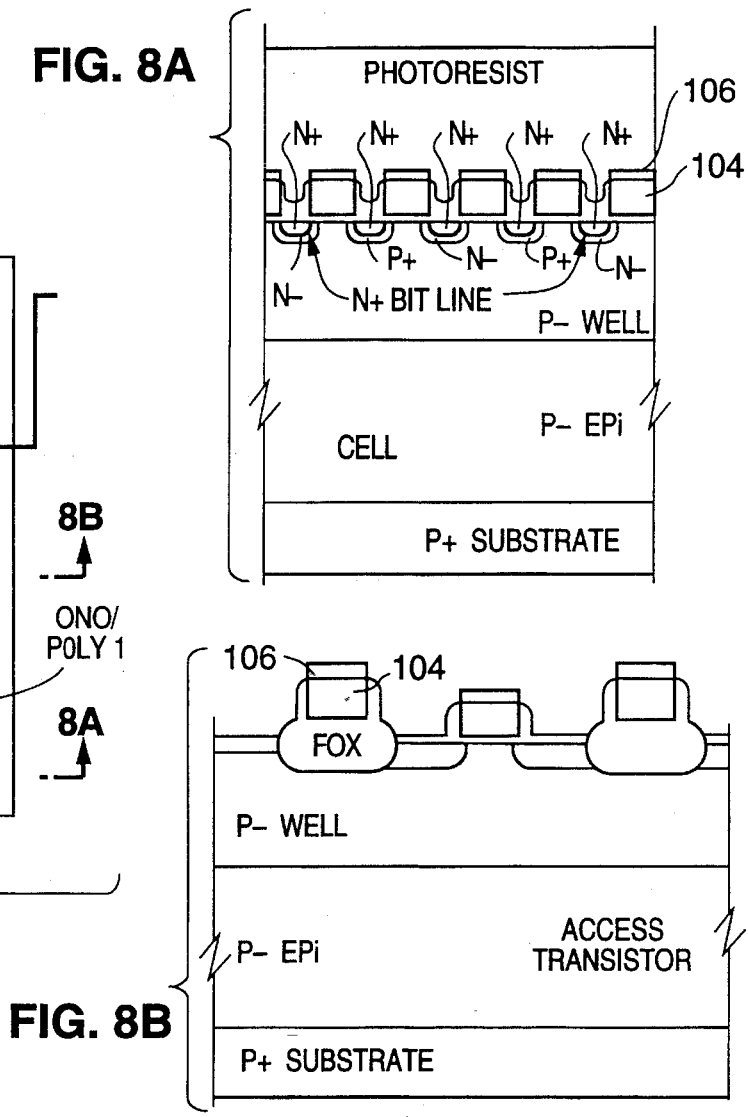
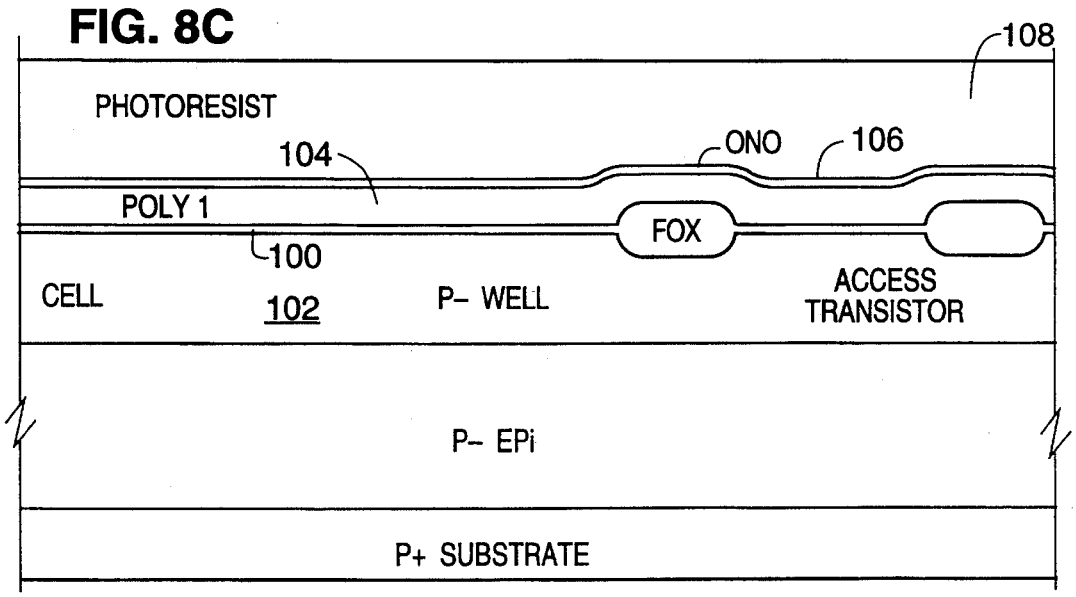
FIG. 8
FIG. 8A
FIG. 8B
FIG. 8C

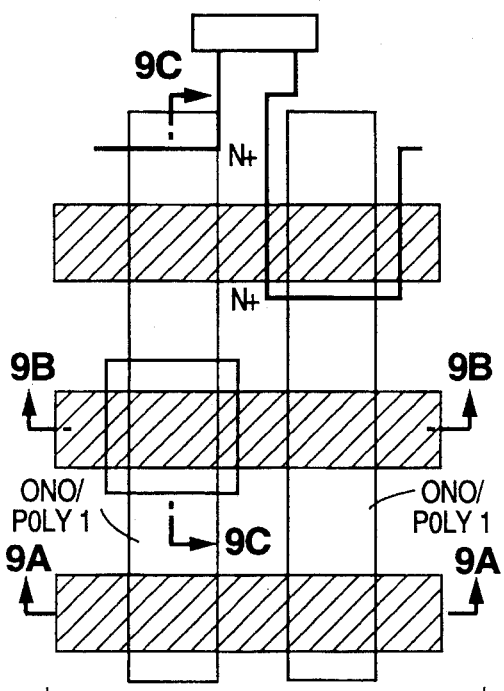
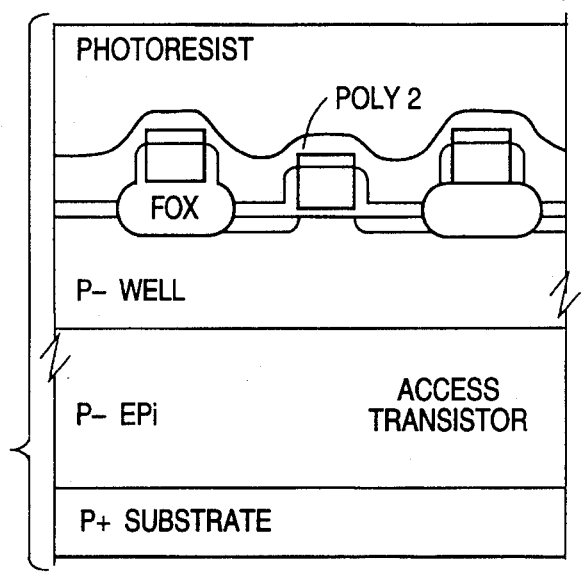
FIG. 9
FIG. 9A
FIG. 9B
FIG. 9C
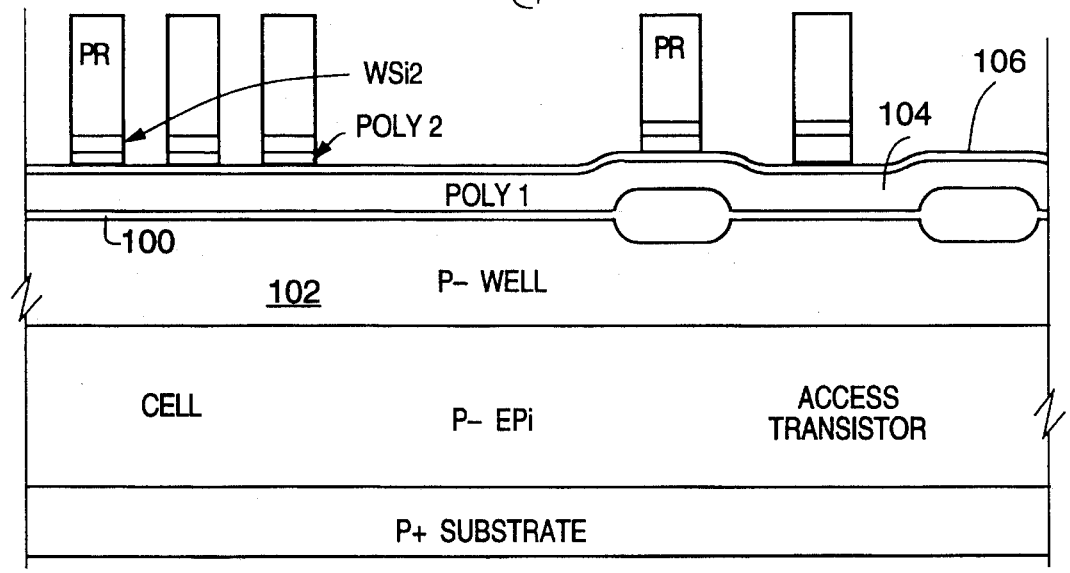

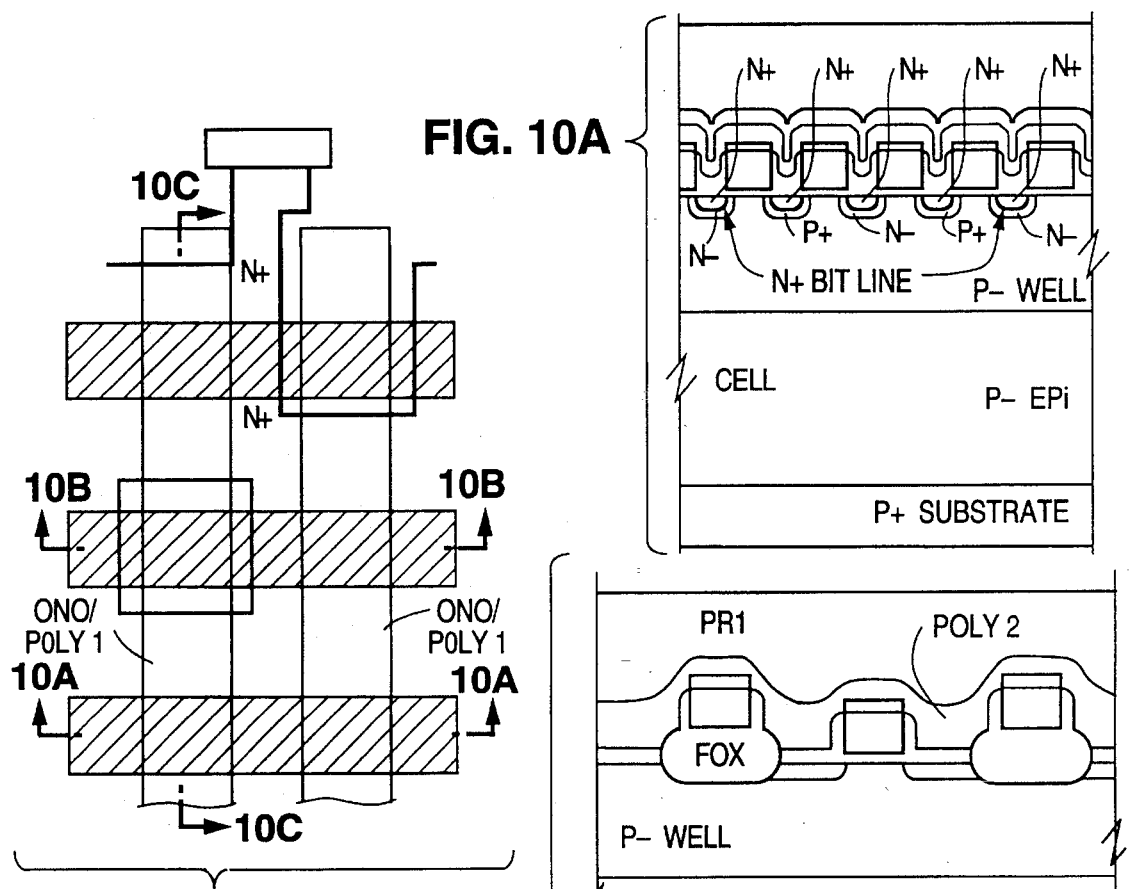
FIG. 10
FIG. 10A
FIG. 10B
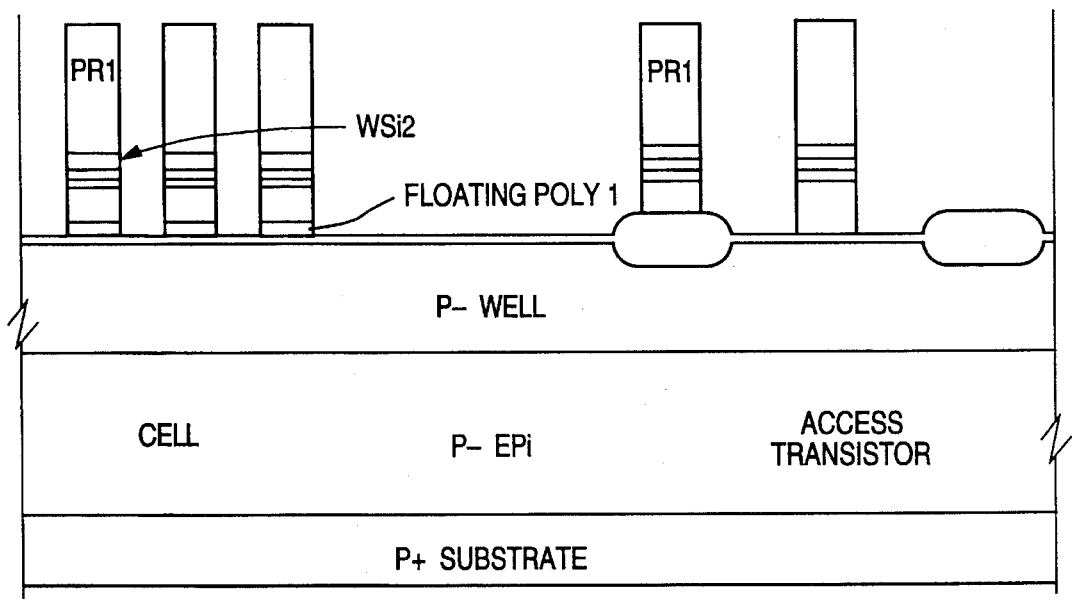
FIG. 10C

METHOD FOR PROGRAMMING AN ALTERNATE METAL/SOURCE VIRTUAL GROUND FLASH EPROM CELL ARRAY

This is a divisional of application Ser. No. 07/830,938, filed Feb. 4, 1992, now U.S., Pat. No. 5,346,842.

BACKGROUND OF THE INVENTION

1. Field of the Invention

The present invention relates to electrically programmable read only memory (EPROM) devices and, in particular, to a flash EPROM cell array that utilizes ETOX cell programming concepts in a true virtual ground, contactless array.

2. Discussions of the Prior Art

An electrically programmable read only memory (EPROM) device is a non-volatile memory integrated circuit which is used to store binary data. Power can be removed from an EPROM without loss of data. That is, upon reapplying power, the originally-stored data is retained.

In addition to its data retention capability, an EPROM can also be programmed to store new binary data. In a conventional EPROM device, reprogramming is accomplished by first exposing the EPROM to an ultra-violet (UV) light source in order to erase the old binary data. A UV-transparent lid on the packaged EPROM chip allows this erasure to occur. Following erasure, the new binary data is written into the EPROM by deactivating the chip select line and switching the EPROM's data outputs to inputs. The EPROM address inputs are then set to a starting value, the desired data is connected to the data inputs and the data is written into the EPROM cell identified by the address inputs. The address inputs are then incremented and the cycle is repeated for each cell in the EPROM array.

In an EPROM read operation, the binary data stored in the cell identified at the address inputs is connected to the chip's data output buffers. If the EPROM's chip select signal is activated, then the binary data from the selected cell is provided to the data bus.

An electrically erasable programmable read only memory (EEPROM) is a variation of the conventional EPROM design. In an EEPROM (sometimes referred to as an $E^2PROM$), binary data is read, written and erased electrically. A single operation erases the selected data storage cell.

More recently, so-called "flash" EPROM devices have become available. In a flash EPROM, all data cells in the array are electrically erased in a single operation.

FIG. 1 shows a portion of Intel's well-known ETOX EPROM array 10 wherein two ETOX cells 12a and 12b share one drain contact 14. FIG. 2 shows a cross-section of an individual ETOX cell 12 taken along line 2—2 (i.e. along polysilicon (poly 2) word line 16) in FIG. 1. FIG. 3 shows a cross-section of an ETOX cell 12 taken along line 3—3 (i.e. along buried N+ bit line 18) in FIG. 1.

The ETOX array 10 is based on the standard "T-shaped" ETOX cell. As shown in FIGS. 2 and 3, the ETOX cell 12 is implementated utilizing a very thin gate oxide 20 (about 100 Å) and graded N+/N− source regions 22 to prevent disturbances due to band-to-band tunneling when the cell 12 is being erased.

As shown in FIG. 4A, the ETOX cell is written in the conventional EPROM manner. That is, hot electrons are injected from the graded source region 22 into the polysilicon (poly 1) floating gate 24 when the poly 2 word line 16 and the N+ bit line (drain) 14 are both high.

As shown in FIG. 4B, erasing the ETOX cell 12 is performed by Fowler-Nordheim tunneling of electrons from the floating gate 24 through the thin oxide 20 to the graded source region 22 when the source region 22 is high, the drain 14 is floating and the word line 16 is low. As stated above, the source 22 is graded to prevent junction breakdown during the erase operation.

As discussed by Verma et al, "Reliability Performance of ETOX Based Flash Memories", the programming of flash EPROM cells, such as the abovedescribed ETOX cell, may cause certain cell disturbances. Thus, an important consideration in the design of flash EPROM cells is the proper selection of read and programming voltages in order to minimize these disturbs.

The three principal flash EPROM cell disturbs that can occur during programming are DC erase, DC program and program disturb. These disturbs impact cells that share a common word line (row) or column with the cell being programmed.

DC erase occurs on programmed cells that are on the same word line as the cell being programmed. The programmed cells have electrons on their floating gates. During programming, the common word line is taken high, causing an electric field across the interpoly dielectric that may be large enough to cause electron flow from the poly 1 floating gate. This results in reduction of the threshold voltage of the programmed cells and can cause loss of data. That is, after a first cell in a row has been programmed, the subsequent programming of the remaining cells on the same row can cause the first cell to lose programming charge.

DC program occurs on unprogrammed or erased cells. These cells, having few electrons on their floating gates, have low threshold voltages. Increasing the voltages on the word lines of these cells creates high electric field across the cell tunnel oxide, resulting potentially in tunneling of electrons to the floating gate from the substrate, thereby increasing the cell's threshold voltage.

Program disturb occurs when a programmed cell that shares a column with a cell being programmed experiences a high electric field between its floating gate and drain. This can cause electrons to tunnel from the floating gate to the drain, thereby reducing the cell's threshold voltage.

Traditionally, reductions in flash EPROM array density have been accomplished by reducing the dimensions of the cell features in the photolithographic and etching procedures utilized in fabricating standard ETOX cells. The shrinking cell geometries resulting from these process developments have led to a need both for complex new isolation schemes for accommodating the reduced minimum cell pitch and for non-standard techniques for forming the many submicron contacts required in an ETOX array. (As stated above, and as shown in FIGS. 1 and 3, the conventional ETOX array architecture requires that the metal bit contact line 26 provide one drain contact 26a for each pair of ETOX cells 12.)

For example, Hisamune et al, "A 3.6 nm² Memory Cell Structure for 16 mb EPROMs", IEDM 1989, pg. 583, disclose a process for minimizing EPROM cell pitch utilizing trench isolation of the bit lines and tungsten plugs for bit line contacts. Bergemont et al, "A High Performance CMOS Process for Sub-micron 16 mv EPROM", IEDM 1989, page 591, also disclose techniques for reducing the size of the standard T-shaped ETOX cell.

In another approach to flash EEPROM design, Intel's Flash Array Contactless EPROM (FACE) technology utilizes a buried N+ bit line to connect EPROM cell transistors. The metal bit line contacts the diffused buried N+ bit line every X cells (where X is typically 36 or 64) rather than utilizing the ETOX approach of one contact per two cells. See (1) B. J. Woo et al, "A Novel Cell Using Flash Array Contactless EPROM (FACE) Technology", IEEE IEDM 90 and (2) B. J. Woo et al, "A Poly-buffered FACE Technology For High Density Flash Memories", VLSI Symposium 1991.

Another way to avoid the special processing requirements associated with the fabrication of high density ETOX cell arrays is to use a cell which does not require the use of field oxide isolation and contacts in the array.

For example, U.S. patent application Ser. No. 539,657, filed by Boaz Eitan on Jun. 13, 1990 for EPROM VIRTUAL GROUND ARRAY, teaches a new contactless EPROM cell array and its associated process flow. Eitan's contactless concept is attractive because it allows high density EPROMs to be fabricated without using aggressive fabrication technologies and design rules.

The basic idea of the Eitan disclosure is the use of a "cross-point" EPROM cell, i.e. a cell which is defined by the crossing of perpendicular poly 1 floating gate and poly 2 word lines in a virtual ground array. In order to avoid drain turn, i.e. electron leakage from unselected cells on the same bit line as a selected cell, metal contacts silicon every two drain bit lines and the non-contacted source bit lines are connected to Vss only via an access transistor, as shown in FIGS. 5 and 6. Additionally, in the Eitan architecture, Each bit line is contacted once every 64 cells, each block of 64 cells on the same bit line constituting 1 segment. Thus, when programming a particular cell, only 1 64 cell segment need be addressed; all other segments are "off" and, therefore, the cells in these unselected segments are not susceptible to leakage.

However, there are several drawbacks associated with the Eitan process flow. First, five layers of processing are required over the poly 1 floating gate layer: oxide/nitride/oxide/poly cap/nitride. The poly 1 and the five overlying layers are defined twice, once at the poly 1 mask step and once at the poly 1 island mask step. These two etching steps are very critical because they define, respectively, the length and width of the EPROM cell. The requirement to etch more layers in these steps presents difficulties in controlling these critical dimensions. Also, failing to remove any one of the five layers presents the risk of poly 1 stringers along the edges of the field oxide. These edges are located in the neighborhood of the access transistors.

Furthermore, because the poly 2 word line in the Eitan array is not self-aligned with the poly 1 floating gate, a special "array field implant" is required to avoid leakage between adjacent bit lines. This leakage occurs when poly 2 is misaligned with poly 1. The poly 2 controls one part of the silicon and leads to a parasitic poly 2 transistor between adjacent bit lines. For this reason, a high threshold voltage is required to avoid the turn on of this parasitic poly 2 transistor. This is done using an array boron field implant.

In addition to the boron field implant, the Eitan process also calls for an "isolation oxide" to move the field threshold to a sufficiently high voltage. This field implant leads to boron lateral diffusion into the channel of the cell, leading to channel width reduction, high bit line loading and reduction of the bit line/substrate breakdown voltage.

Additionally, the poly 2 etch is very critical in the Eitan process. The poly 2 etching terminates on a poly cap. In order to maintain the coupling ratio, it is necessary to stop the etch within a nominal poly cap thickness. This is difficult from the point of view of overetched latitude with a thin poly cap layer. Depending on the thickness of the isolation oxide, poly 1 to poly 2 misalignment will affect the parasitic capacitance of the word lines.

Furthermore, removing the top nitride before depositing the poly 2 word line may affect the quality of the oxides all around the poly 1 floating gate. This could affect program disturb and data retention.

Thus, it would be highly desireable to have available a flash EPROM array that avoids the drawbacks of the Eitan array, eliminates the multi-contact limitations of the conventional T-cell ETOX array, but retains the drain turn-on immunity of the Eitan architecture.

SUMMARY OF THE INVENTION

A better understanding of the features and advantages of the invention will be obtained by reference to the following detailed description and accompanying drawings which set forth an illustrative embodiment in which the principles of the invention are utilized.

DESCRIPTION OF THE DRAWINGS

FIGS. 7–10 illustrate sequentially a process flow for fabricating an alternate metal/source virtual ground flash EPROM cell array in accordance with the present invention.

DETAILED DESCRIPTION OF THE INVENTION

A process methodology will now be described for stacked etch fabrication of an alternate metal/source virtual ground flash EPROM cell array in accordance with the concepts of the present invention. The array utilizes cross-point cells with internal access transistors.

The invention will be described in conjuction with FIGS.

7–10 which illustrate sequential steps in the process flow. Each figure includes a plan view of the structure at that stage of the process flow and the following three corresponding cross-sectional views in the structure: (1) in the word line direction in the EPROM cell array (designated "A/A"), (2) in the word line direction in the access transistor area (designated "B/B"), and (3) in the poly 1 direction perpendicular to the word line the access transistor array (designated "C/C").

Figure 1:
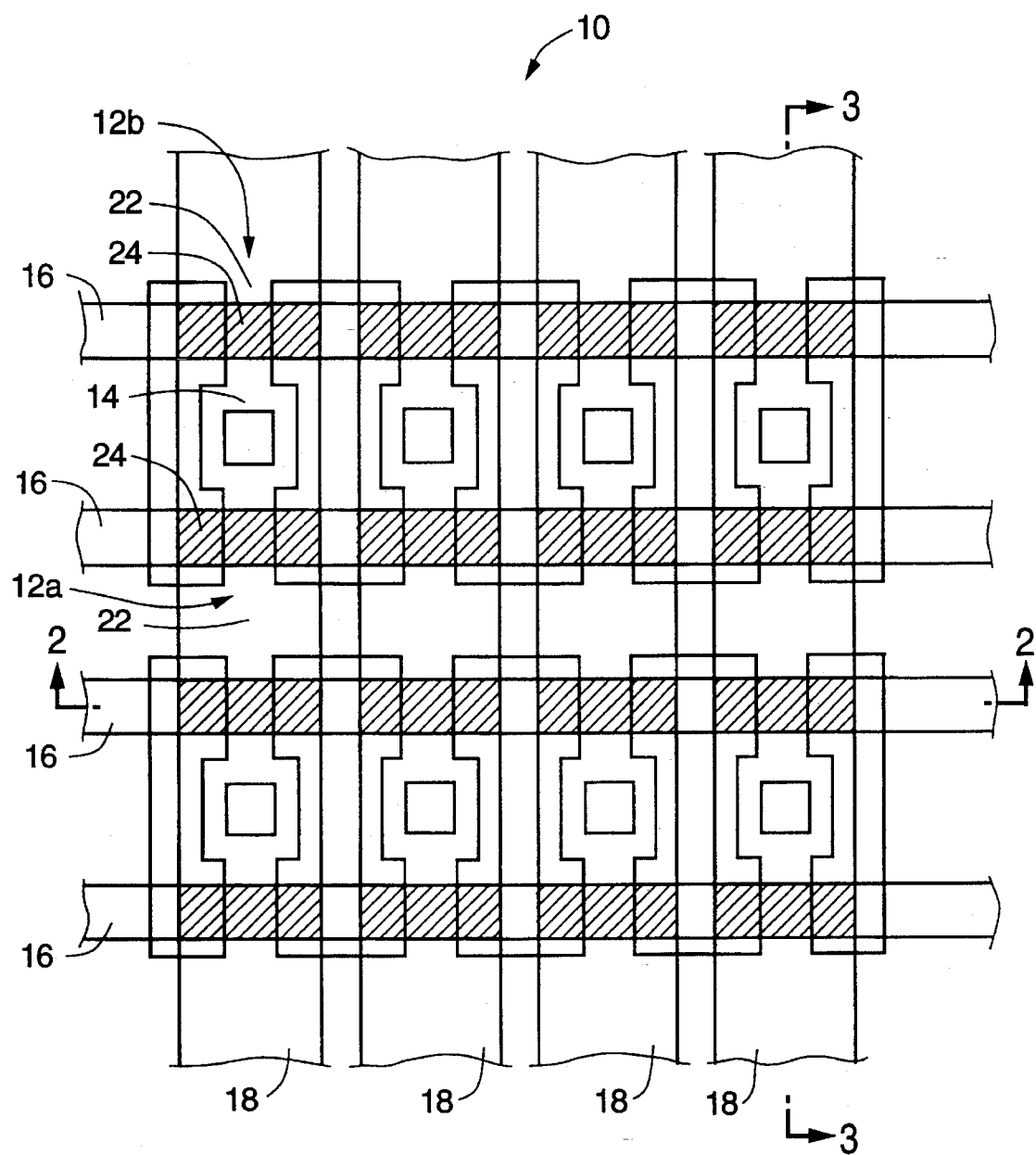
FIG. 1 is layout illustrating a portion of a conventional T-shaped ETOX EPROM cell array.
Figure 2:
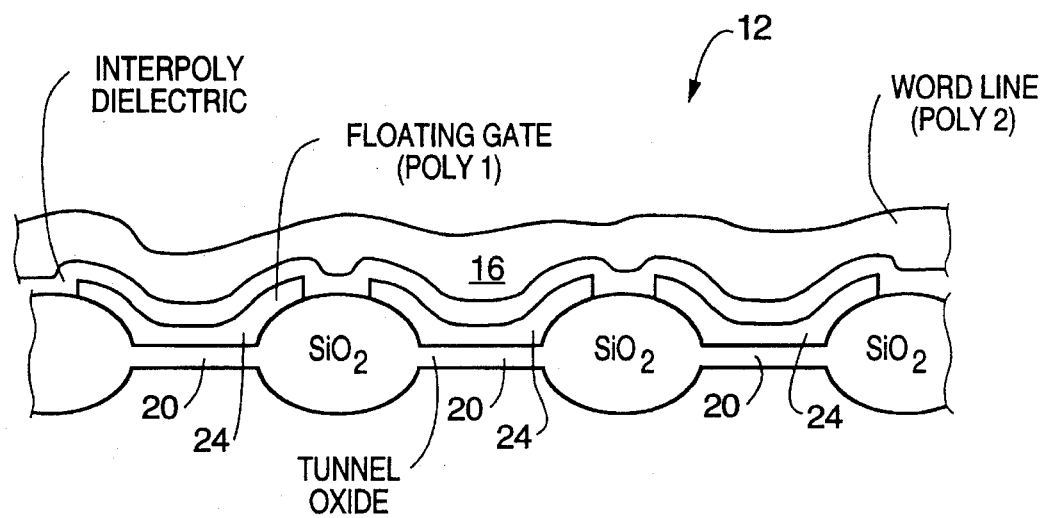
FIG. 2 is a cross-sectional view illustrating an individual ETOX cell taken along line A—A of FIG. 1.
Figure 3:
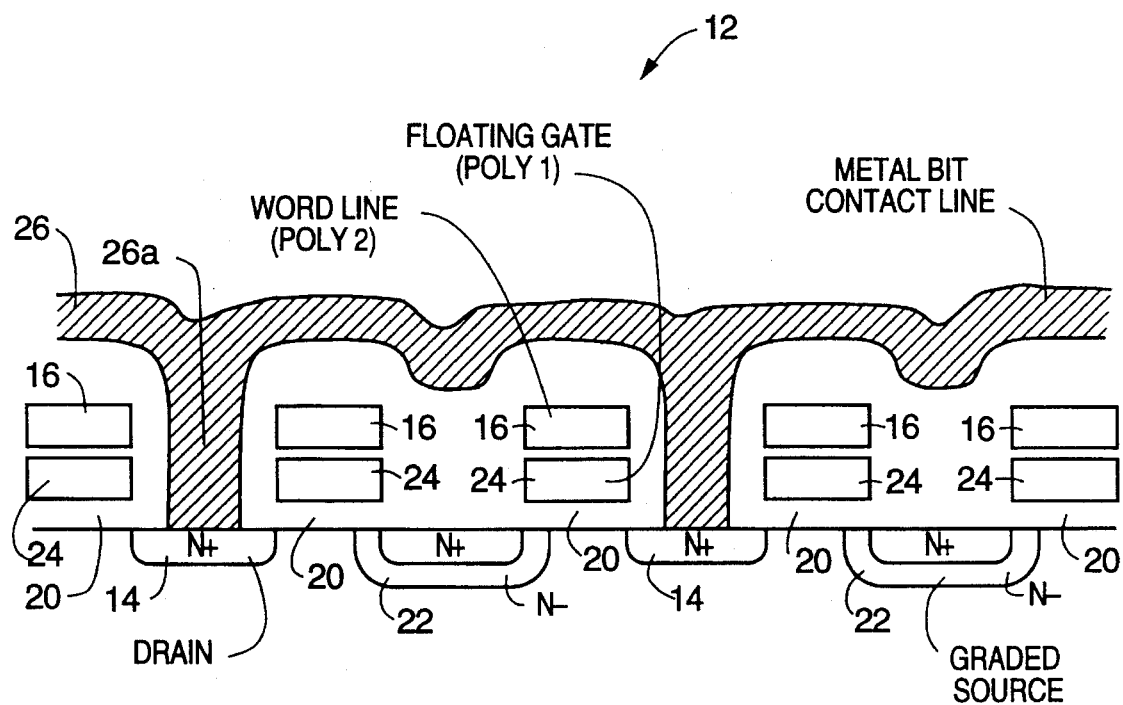
FIG. 3 is a cross-sectional view illustrating an individual ETOX cell taken along line B—B of FIG. 1.
Figure 4A:
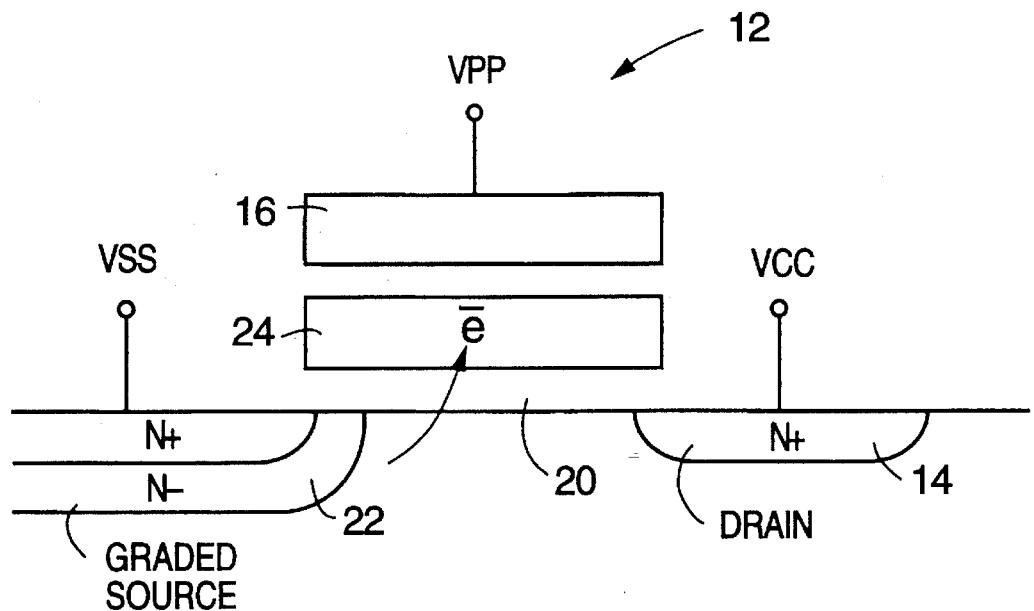
FIG. 4A is a cross-sectional view illustrating conventional ETOX cell programming by hot electron injection to the cell's floating gate.
Figure 4B:
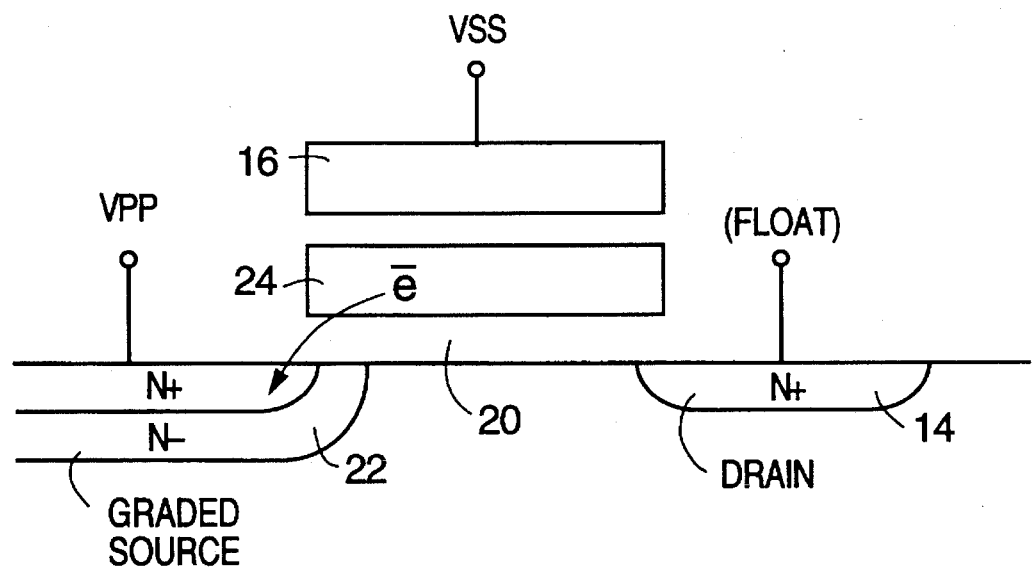
FIG. 4B is a cross-sectional view illustrating ETOX cell erasure by Fowler-Nordheim tunneling of electrons from the cell's floating gate.
Figure 5:
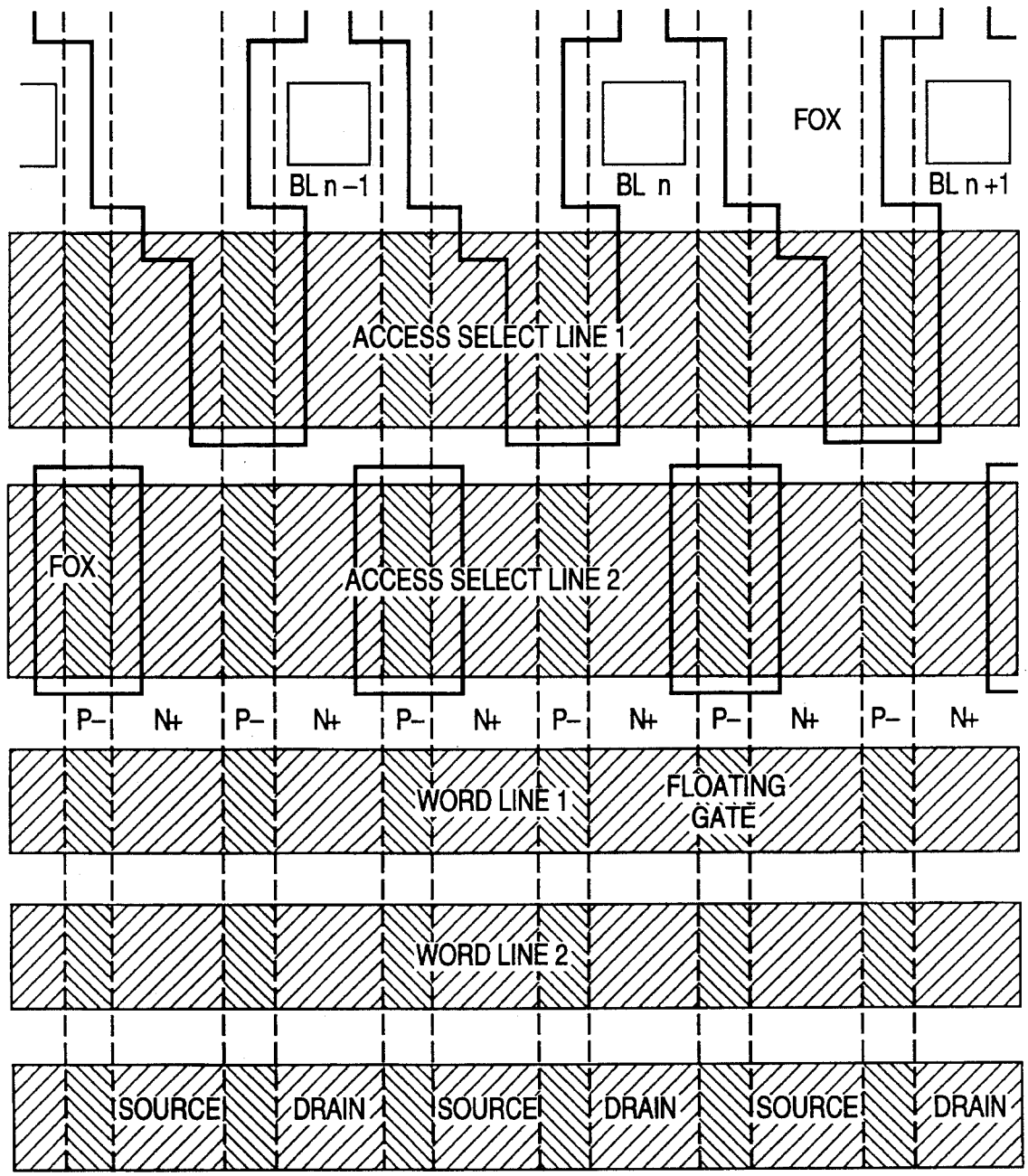
FIG. 5 is a layout illustrating a portion of a conventional cross-point contactless EPROM cell array.
Figure 6:
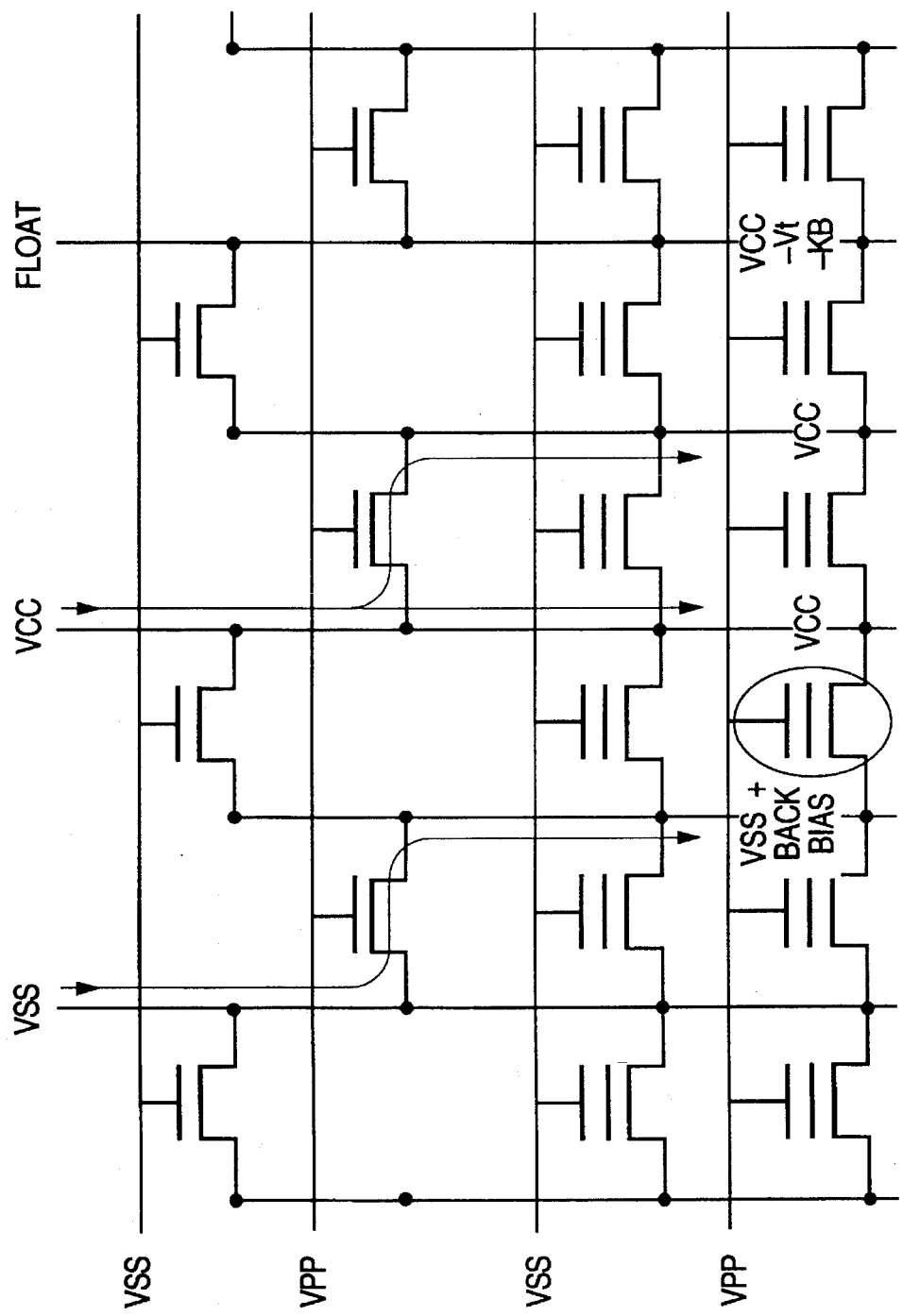
FIG. 6 is a schematic diagram illustrating an equivalent circuit for the FIG. 5 layout.
Figure 7:
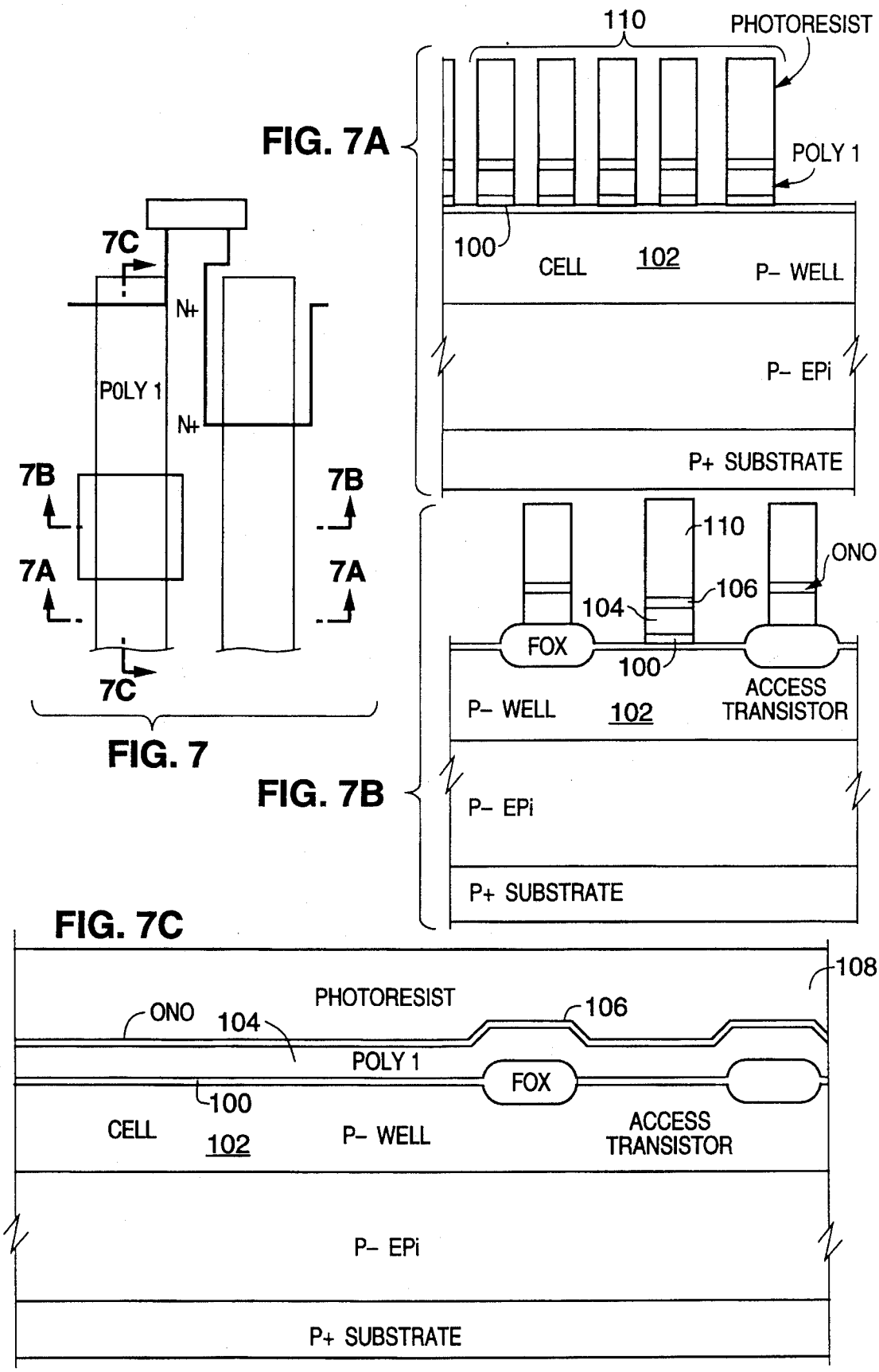

Referring to FIG. 7, the process flow begins with conventional steps common to this type of process and then, with the formation of a 100 Å floating gate oxide 100 on a P-type silicon substrate 102. A layer of polysilicon (poly 1) 104 is then deposited to a thickness of about 1500 Å and doped with phosphorus at a dose of $2-5\times10^{15}$ at low implant energy.

Next, as shown in FIG. 7, a composite dielectric layer of oxide/nitride/oxide 106, commonly called "ONO", is formed on the poly 1 After growing this ONO layer, a photoresist mask 108 is used to define vertical strips on the ONO. The ONO 106 and underlying poly 1 104 are then plasma etched to form parallel vertical lines 110 of ONO/poly 1.

Referring to FIG. 8, after stripping the photoresist 108 from the poly 1 mask, a thin edge oxide is grown between the poly 1 lines 110. The poly 1 lines are then used in a self-aligned arsenic implant to define the N+ bit lines. Next, in accordance with the present invention, alternate N+ bit lines are masked and phosphorus is implanted into the exposed bit lines to provide alternate graded N+/N− source regions for the cells of the EPROM array. Optionally, this graded source implant can be followed by a mask step for implanting boron into the drain bit lines, as shown in FIG. 8. Ultimately, in a reversal of the above-discussed Eitan concept, the N+/N− graded source bit lines are contacted by metal in segmented fashion, while the intermediate node drain bit lines are uncontacted.

Next, a "differential" oxide is grown over the N+ bit line areas to provide substantial latitude in subsequent ONO and/or poly plasma etch steps. If, for example, a poly plasma etch is performed without formation of the differential oxide, then the poly plasma etch step could lead to the "digging" of silicon in the exposed N+ bit line areas. For this reason, this step contributes to the equivalent oxide loss during ONO etch and is, hence, called differential oxidation.

Next, a mask step called "protect array" is performed. This mask has two goals: First, to etch away, out of the array, the ONO/poly 1 layer (the poly 1 mask is a dark field mask) leaving ONO/poly 1 in the array. This avoids the use of an extra mask to protect the periphery at the N+ bit line arsenic implant. The arsenic implant is performed on the full wafer with no mask.

Next, the ONO/poly 1 layers are plasma etched and the underlying floating gate oxide is etched off in wet chemistry utilizing diluted HF. Then, the photoresist is stripped.

Referring now to FIG. 9, the next step in the process involves the growth of 200 Å gate oxide everywhere in the gate channel regions out of the array. A threshold voltage mask ($V_{tp}$ mask) is then performed and P-channel regions are boron implanted to provide the right threshold voltage. After $V_{tp}$ mask photoresist strip, a second layer of 2000 Å polysilicon (poly 2) is deposited and doped with phosphorous. Then, a 2500 Å tungsten silicide layer is deposited and a poly 2 mask is performed. The poly 2 mask has three functions: defining the gates of the transistors in the periphery, defining the gates of the access transistors in the array, and defining the word lines of the EPROM cells. Next, the tungsten silicide layer and the poly 2 layer are plasma etched. It is noted that the access transistors are flash EPROM cells with larger width than the array flash EPROM cells to drive larger current than the array cells.

Referring to FIG. 10, after this plasma etch, the photoresist is not stripped. A second photoresist is spun on and a new masking step is performed. This new mask, called self-aligned etch, maintains the integrity of the photoresist of the preceding poly 2 mask in order to allow self-aligned etch to poly 2 of the residual ONO/poly 1 layer between the lines in the flash EPROM cell array. This etch ends the construction of the flash EPROM cell.

Figure 11:
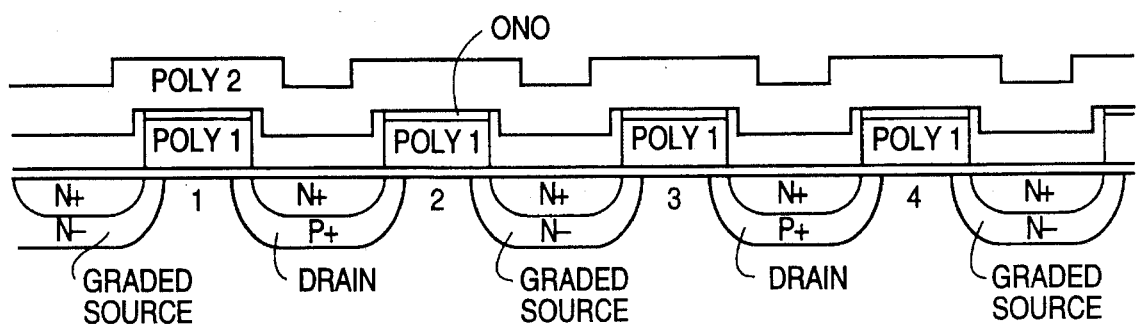
FIG. 11 is a cross-sectional view illustrating a portion of an alternate metal/source virtual ground flash EPROM cell array in accordance with the present invention.

FIG. 11 shows a more detailed cross-section of the alternate metal/source virtual ground EPROM cell array with graded (N+/N−) source regions and N+/P+ drain regions. The equivalent schematic is shown in FIG. 12.

Figure 12:
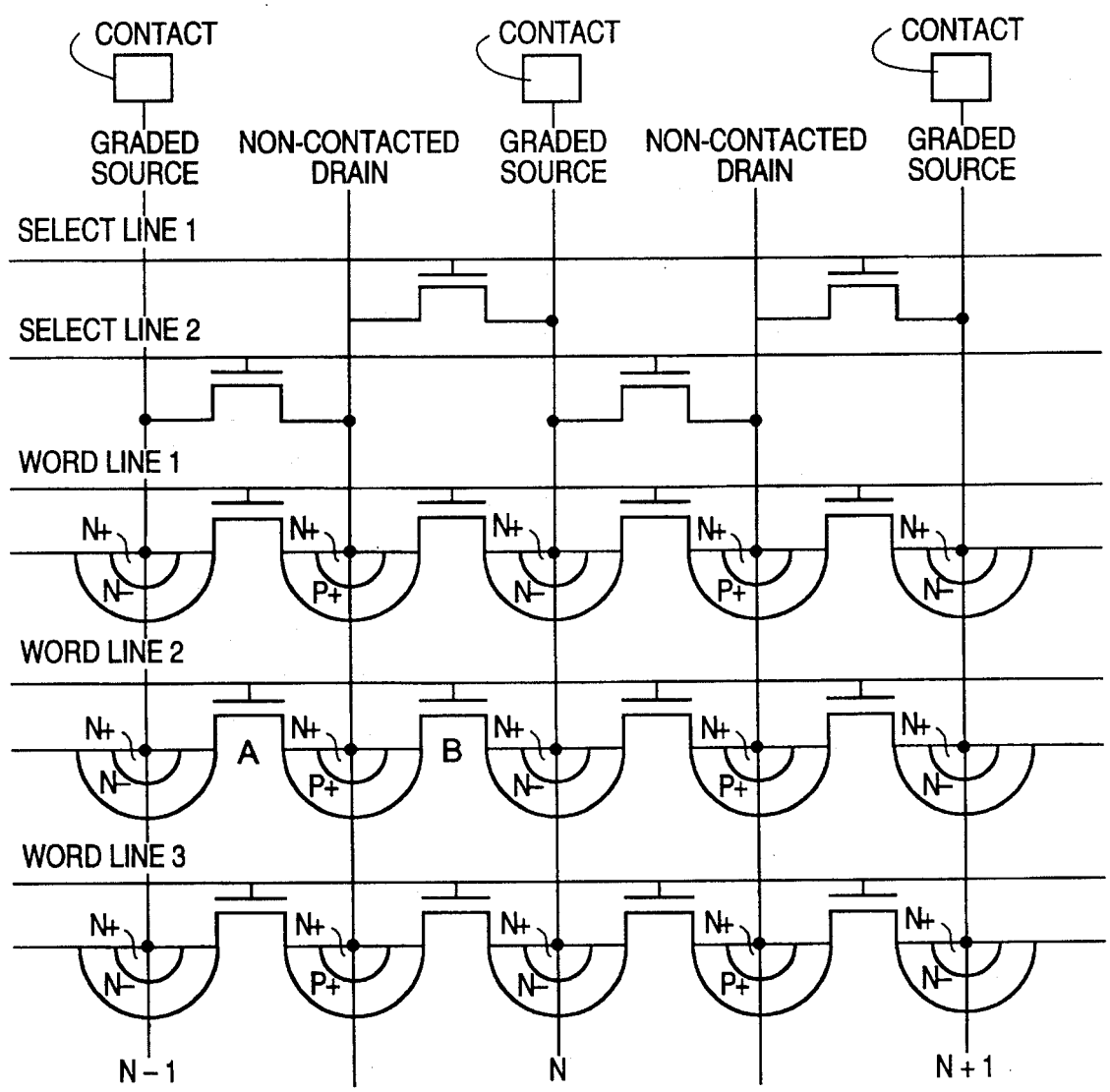
FIG. 12 is a schematic diagram illustrating the circuit equivalent for the FIG. 11 array.

Referring to FIG. 12, to program cell A, with word line 2 at Vpp, bit line N−1 is held at Vss and bit line N is taken to Vcc while bit line N+1 is allowed to float; the programming voltage Vcc is applied to select line 1, while select line 2 is held at Vss. This drives the Vcc on the intermediate node drain, which, as stated above, is non-contacted. This regime causes hot electron injection from the drain side to the floating gate.

Similarly, to program cell B, with word line 2 at Vpp, bit line N−1 is taken to Vcc, and bit line N is held at Vss while bit line N+1 is allowed to float; the programming voltage Vcc is applied to select line 2, while select line 1 is held at Vss.

In the flash erase mode, erase voltage Ver is applied to each of the bit lines (N−1, N, N+1), while select line 1 and select line 2 are held at Vss. This cause Fowler-Nordheim tunneling of electrons from the floating gate to the source side of the cell. The graded N+/N− source junction prevents junction breakdown.

Figure 13:
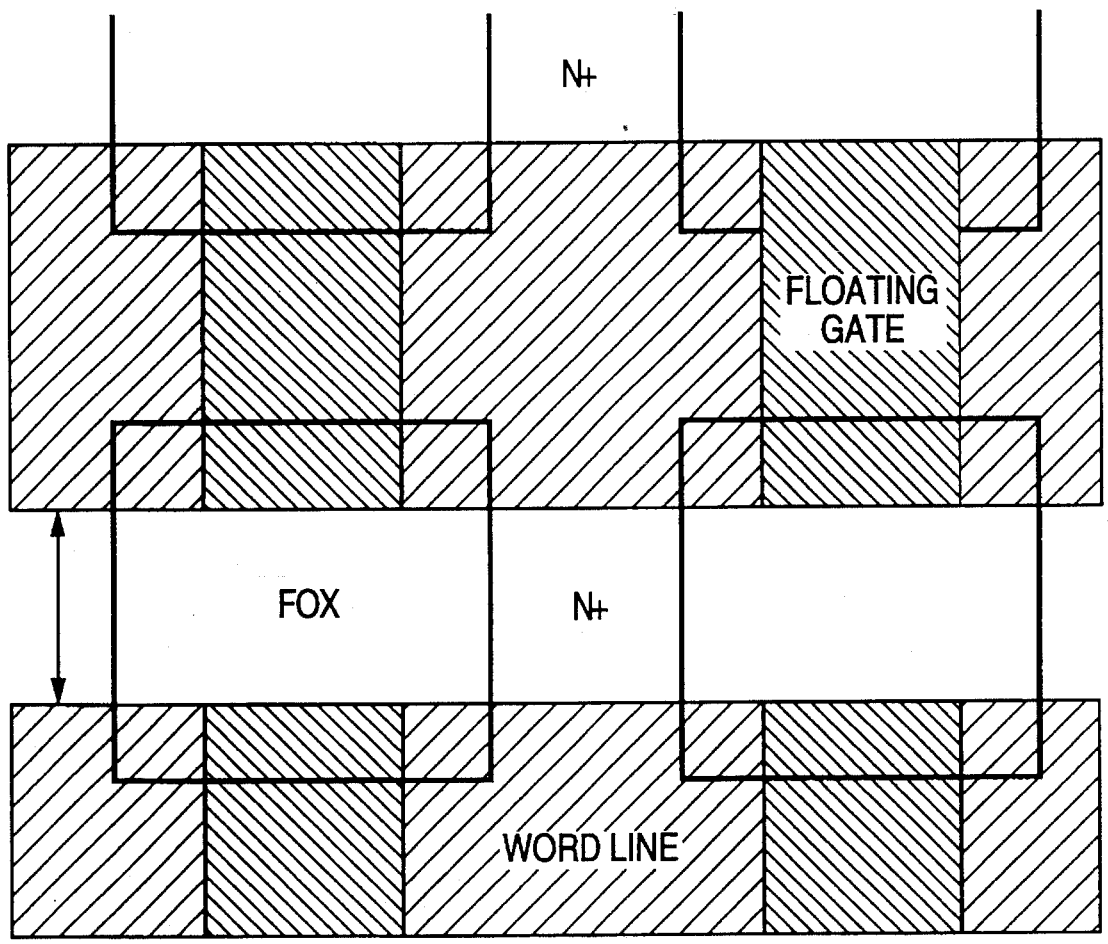
FIG. 13 is a layout illustrating an alternate metal/source virtual ground flash EPROM cell in accordance with the present invention.
Figure 14:
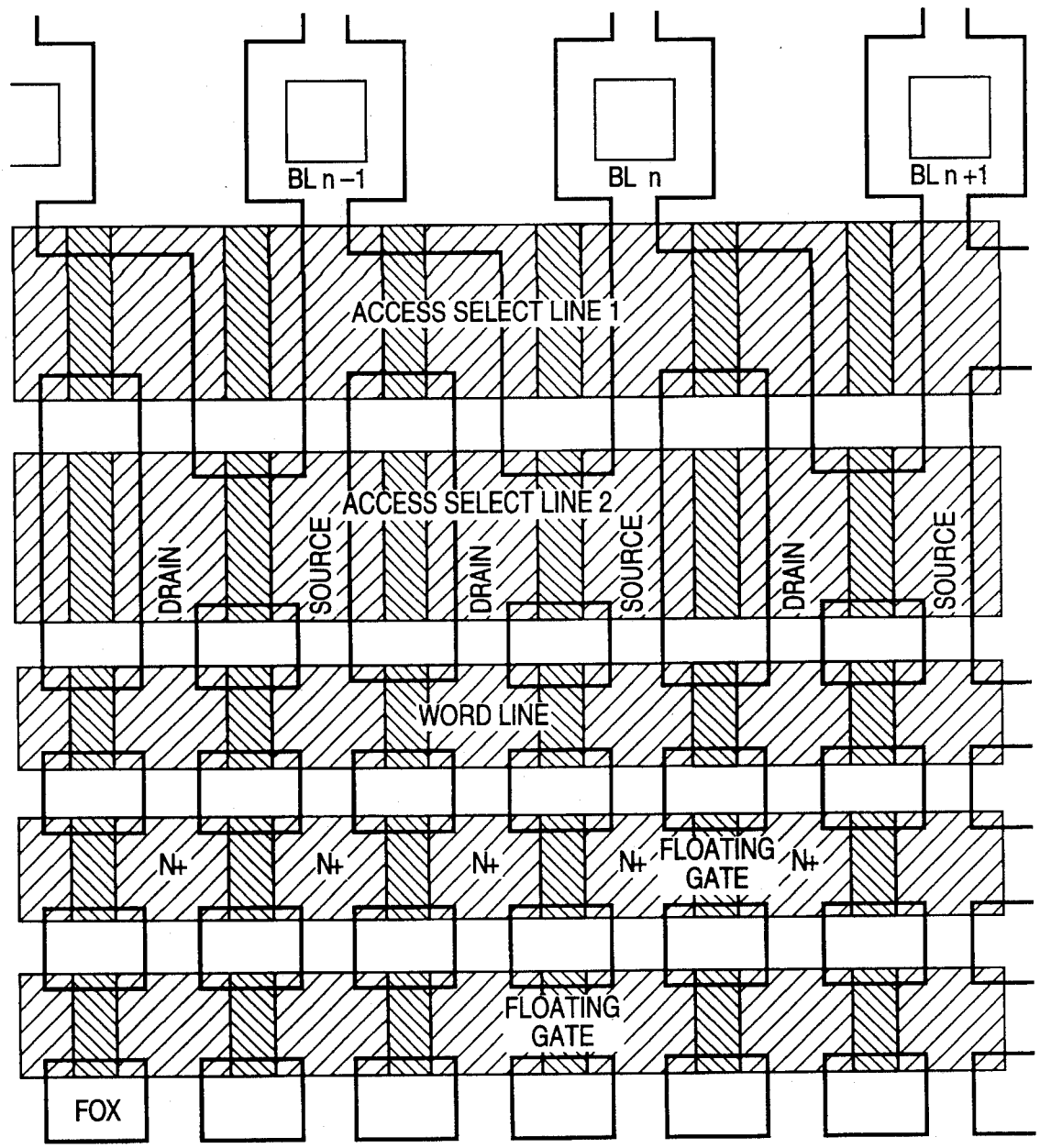
FIG. 14 is a layout illustrating an alternate metal/source virtual ground flash EPROM cell array in accordance with the present invention.

FIGS. 13 and 14 show layouts for an alternate metal/source virtual ground flash EPROM cell and array, respectively, in accordance with the present invention.

The above-described array offers the programming mechanism of the conventional T-shaped ETOX cell, but with much smaller cell size and easier scalability than the T-shaped ETOX cell because of the contactless architecture and with better drain turn-on immunity.

The architecture does require a true bit line virtual ground decoding design which may affect array efficiency.

It should be understood that various alternatives to the embodiments of the invention described herein may be employed in practicing the invention. It is intended that the following claims define the scope of the invention and that methods and structures within the scope of these claims and their equivalents be covered thereby.

What is claimed is:

1. A method of flash erasing programmed cross-point flash EPROM cells in an alternate source virtual ground flash EPROM array formed in a silicon substrate of P-type conductivity, wherein the flash EPROM array includes a layer of first insulating material formed on the silicon substrate, a plurality of spaced-apart, parallel vertical strips of second insulating material and underlying first conductive material formed on the first insulating material, a plurality of buried N+ bit lines formed in the surface of the semiconductor substrate between areas of the semiconductor substrate directly beneath the vertical strips, alternate buried N+ bit lines having additional N-type dopant introduced thereto to define graded N+/N− source lines that alternate with buried N+ drain lines, a plurality of spaced-apart parallel word lines of second conductive material formed perpendicular to the vertical strips such that the second conductive material is separated from the first conductive material by the second insulating material, the intersection of a word line and a vertical strip defining the location of a cross-point flash EPROM cell, the flash EPROM array further including, for each buried N+ drain line in the array, a first MOS select transistor connected between said buried N+ drain line and a first adjacent graded N+/N− source line, a first select line connected to a gate of the first MOS select transistor, and a second MOS select transistor connected between said buried N+ drain line and second adjacent N+/N− graded source line, a second select line connected to a gate of the second MOS select transistor, the flash erasing method comprising:

applying an erase voltage level to each of the graded source lines; and holding both the first select line and the second select line at a low voltage level.

* * * * *